(12) United States Patent
Kim et al.

(10) Patent No.: US 10,326,446 B2
(45) Date of Patent: Jun. 18, 2019

(54) SEMICONDUCTOR APPARATUS INCLUDING A POWER GATING CIRCUIT AND A REPAIR METHOD OF THE SEMICONDUCTOR APPARATUS

(71) Applicant: SK hynix Inc., Icheon-si Gyeonggi-do (KR)

(72) Inventors: Woongrae Kim, Icheon-si (KR); Bok Rim Ko, Seoul (KR); A Ram Rim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/830,917

(22) Filed: Dec. 4, 2017

(65) Prior Publication Data

US 2018/0337676 A1    Nov. 22, 2018

(30) Foreign Application Priority Data

May 22, 2017    (KR) ........................ 10-2017-0062944

(51) Int. Cl.
| | | |
|---|---|---|
| *H03K 3/00* | (2006.01) | |
| *H03K 19/003* | (2006.01) | |
| *H03K 17/687* | (2006.01) | |
| *H01L 23/525* | (2006.01) | |
| *H03K 19/00* | (2006.01) | |

(52) U.S. Cl.
CPC ....... *H03K 19/003* (2013.01); *H01L 23/5256* (2013.01); *H03K 17/687* (2013.01); *H03K 19/0016* (2013.01)

(58) Field of Classification Search
CPC . H01L 23/5256; H03K 17/687; H03K 19/003
See application file for complete search history.

(56) References Cited

U.S. PATENT DOCUMENTS

| | | | | |
|---|---|---|---|---|
| 6,901,014 B2* | 5/2005 | Son | ................ | G11C 29/12005 365/200 |
| 7,088,131 B1* | 8/2006 | Stout | ........................ | G11C 5/14 326/33 |
| 7,581,124 B1* | 8/2009 | Jacobson | ................ | G11C 5/14 713/300 |
| 9,450,580 B2 | 9/2016 | Lundberg | | |
| 2002/0008999 A1* | 1/2002 | Hidaka | .............. | H03K 19/0016 365/200 |

(Continued)

*Primary Examiner* — Alexander H Taningco
*Assistant Examiner* — Kurtis R Bahr
(74) *Attorney, Agent, or Firm* — William Park & Associates Ltd.

(57) ABSTRACT

A semiconductor apparatus may include a logic circuit, a power gating circuit and a power gating control system. The logic circuit may operate by receiving a first power supply voltage and a second power supply voltage, and may retain an output signal at a predetermined logic value during a standby operation of the semiconductor apparatus. The power gating circuit may apply the first power supply voltage and the second power supply voltage to the logic circuit when a gating control signal is in an enabled state. The power gating control system may test whether the output signal of the logic circuit retains the predetermined logic value when the power gating circuit is turned off, and may generate the gating control signal based on a test result and an operation mode of the semiconductor apparatus.

22 Claims, 5 Drawing Sheets

(56) References Cited

U.S. PATENT DOCUMENTS

| | | | |
|---|---|---|---|
| 2008/0019207 A1* | 1/2008 | Noda | G11C 7/1045 365/227 |
| 2008/0143423 A1* | 6/2008 | Komatsu | H01L 21/823878 327/534 |
| 2012/0200345 A1* | 8/2012 | Kim | H03K 19/0016 327/543 |
| 2017/0070225 A1* | 3/2017 | Kim | H03K 17/6871 |

* cited by examiner

SEMICONDUCTOR APPARATUS INCLUDING A POWER GATING CIRCUIT AND A REPAIR METHOD OF THE SEMICONDUCTOR APPARATUS

CROSS-REFERENCES TO RELATED APPLICATION

The present application claims priority under 35 U.S.C. § 119(a) to Korean application number 10-2017-0062944, filed on May 22, 2017, in the Korean Intellectual Property Office, which is incorporated herein by reference in its entirety.

BACKGROUND

1. Technical Field

Various embodiments generally relate to a semiconductor technology, and, more particularly, to a semiconductor apparatus including a power gating circuit and a repair method of the semiconductor apparatus.

2. Related Art

An electronic apparatus may include a large number of electronic components. A computer system as an electronic apparatus may include many electronic components which are configured by semiconductor apparatuses. The semiconductor apparatuses which configure the computer system may operate by being applied with a power supply voltage. The power supply voltage may be applied from an external power source such as a power management integrated circuit. The semiconductor apparatuses may operate in various operation modes, and may generally perform an active operation and a standby operation. The active operation is an operation mode in which the semiconductor apparatuses are actually performing functions that they are capable of performing, and the standby operation is a sleep mode in which the semiconductor apparatuses consume minimum power. The semiconductor apparatuses may use a power gating circuit to minimize power consumption in the standby operation. The power gating circuit may couple various logic circuits configuring each of the semiconductor apparatuses, with terminals to be applied with the power supply voltage, and thereby apply the power supply voltage to the various logic circuits, and may cut off the coupling of the power supply voltage and the logic circuits and thereby reduce power consumption in the standby mode of each of the semiconductor apparatuses.

Each of the semiconductor apparatuses may use a zigzag power gating scheme. The zigzag power gating scheme may include header transistors which gate a power supply voltage having a high level and footer transistors which gate a power supply voltage having a low level. The header transistors and the footer transistors may be coupled to zigzag with the logic circuits. If the sequence of the header transistors and the footer transistors coupled in zigzag or the kind of transistors is slightly different, a problem may be caused in that the logic circuits may not operate normally or leakage current may increase.

SUMMARY

In an embodiment, a semiconductor apparatus may be provided. The semiconductor apparatus may include a logic circuit configured to operate by receiving a first power supply voltage and a second power supply voltage, and to retain an output signal at a predetermined logic value during a standby operation of the semiconductor apparatus. The semiconductor apparatus may include a power gating circuit configured to apply the first power supply voltage and the second power supply voltage to the logic circuit when a gating control signal is in an enabled state. The semiconductor apparatus may include a power gating control system configured to test whether the output signal of the logic circuit retains the predetermined logic value when the power gating circuit is turned off, and to generate the gating control signal based on a test result and an operation mode of the semiconductor apparatus.

In an embodiment, a repair method of a semiconductor apparatus may be provided. The semiconductor apparatus may include a logic circuit and a power gating circuit which may be configured to apply a first power supply voltage and a second power supply voltage to the logic circuit based on an operation mode of the semiconductor apparatus. The repair method may include. testing whether the logic circuit generates an output signal having a predetermined level when the power gating circuit is turned off. The repair method may include controlling the power gating circuit based on a test result and an operation mode of the semiconductor apparatus.

In an embodiment, a semiconductor apparatus may be provided. The semiconductor apparatus may include a first power supply voltage line supplied with a first power supply voltage. The semiconductor apparatus may include a first virtual power supply voltage line. The semiconductor apparatus may include a second power supply voltage line supplied with a second power supply voltage. The semiconductor apparatus may include a second virtual power supply voltage line. The semiconductor apparatus may include a power gating circuit configured to apply the first power supply voltage to the first virtual power supply voltage line and to apply the second power supply voltage to the second virtual power supply voltage line, based on a gating control signal. The semiconductor apparatus may include a logic circuit coupled with the first power supply voltage line, the first virtual power supply voltage line, the second power supply voltage line and the second virtual power supply voltage line. The semiconductor apparatus may include a power gating control system configured to generate a repair signal based on whether the logic circuit generates an output signal of a predetermined level when the power gating circuit is turned off, and to generate the gating control signal based on the repair signal and an operation mode of the semiconductor apparatus.

In an embodiment, a semiconductor apparatus may be provided. The semiconductor apparatus may include a power gating control system configured to turn off a power gating circuit during a standby operation of the semiconductor apparatus, unless a design of the power gating circuit is inappropriately implemented, then the power gating control system is configured to retain an on state of the power gating circuit during the standby operation of the semiconductor apparatus.

DETAILED DESCRIPTION

Hereinafter, a semiconductor apparatus including a power gating circuit and a repair method thereof will be described below with reference to the accompanying drawings through various examples of embodiments.

Figure 1:
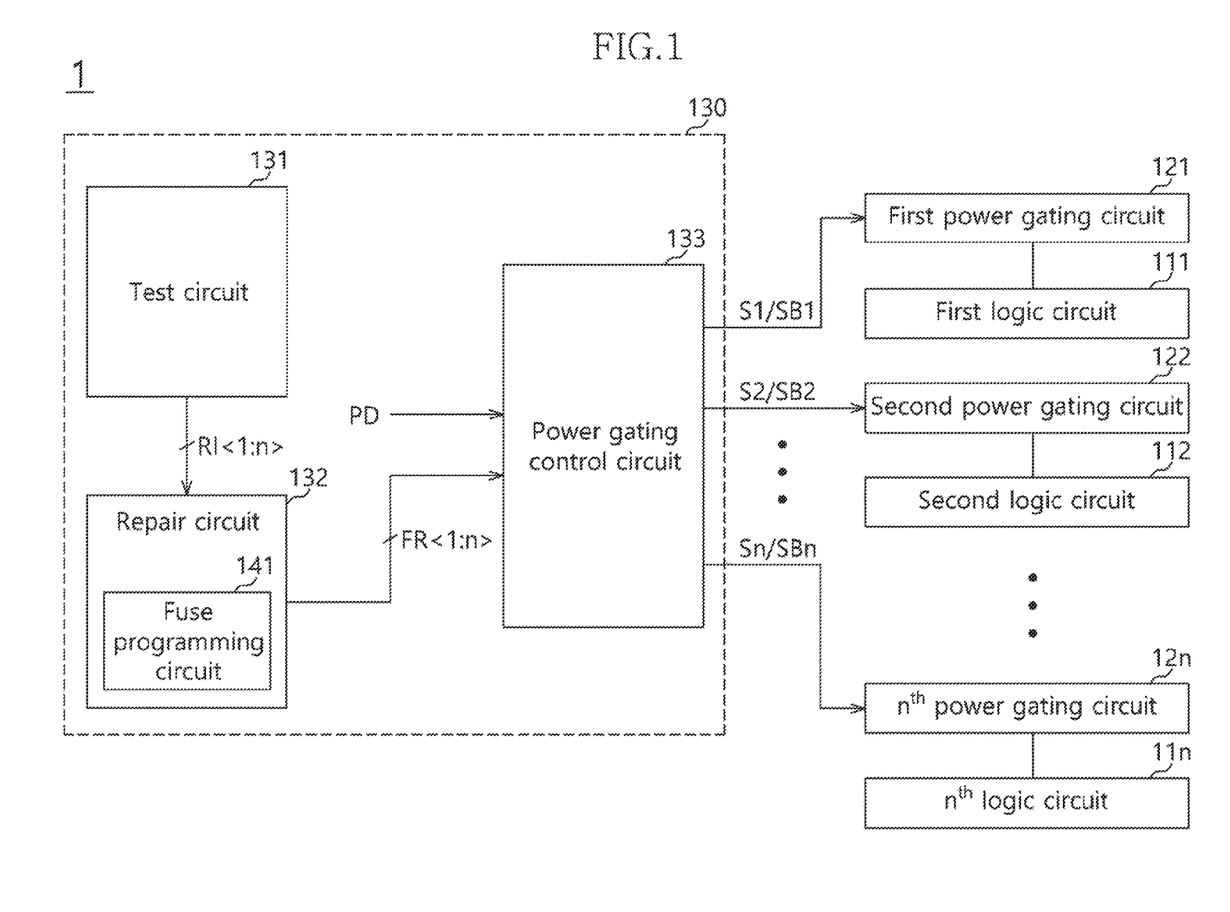
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 1 in accordance with an embodiment. Referring to FIG. 1, the semiconductor apparatus 1 may include at least one logic circuit, at least one power gating circuit, and a power gating control system 130. Referring to FIG. 1, it is illustrated that the semiconductor apparatus 1 includes first to $n^{th}$ logic circuits 111, 112, ..., 11n (n is an integer equal to or greater than 3) and first to nth power gating circuits 121, 122, ..., 12n which are one-to-one coupled to the first to $n^{th}$ logic circuits 111, 112, ..., 11n, respectively. The first to $n^{th}$ logic circuits 111, 112, ..., 11n may operate by receiving a power supply voltage. The semiconductor apparatus 1 may operate in a plurality of operation modes. For example, the semiconductor apparatus 1 may perform an active operation and a standby operation. The active operation may be an operation mode in which the semiconductor apparatus 1 may perform various functions that it performs, and the standby operation may be a sleep mode in which the semiconductor apparatus 1 consumes minimum power. Each of the first to $n^{th}$ logic circuits 111, 112, ..., 11n may generate an output signal which has a predetermined level, during the standby operation of the semiconductor apparatus 1. Each of the first to $n^{th}$ logic circuits 111, 112, ..., 11n may retain the output signal at a predetermined logic value during the standby operation of the semiconductor apparatus 1.

The first to $n^{th}$ power gating circuits 121, 122, ..., 12n may apply the power supply voltage to the first to $n^{th}$ logic circuits 111, 112, ..., 11n, respectively, based on an operation mode of the semiconductor apparatus 1. For example, the first to $n^{th}$ power gating circuits 121, 122, ..., 12n may be turned on during the active operation of the semiconductor apparatus 1, and may apply the power supply voltage to the first to $n^{th}$ logic circuits 111, 112, ..., 11n. The first to $n^{th}$ power gating circuits 121, 122, ..., 12n may be turned off during the standby operation of the semiconductor apparatus 1, and may cut off the application of the power supply voltage to the first to $n^{th}$ logic circuits 111, 112, ..., 11n. The first to $n^{th}$ power gating circuits 121, 122, ..., 12n may operate by receiving gating control signals S1, SB1, S2, SB2, ..., Sn, SBn which are allocated thereto, respectively. For example, the first to $n^{th}$ power gating circuits 121, 122, ..., 12n may apply the power supply voltage to the first to $n^{th}$ logic circuits 111, 112, ..., 11n coupled thereto, respectively, when the gating control signals S1, SB1, S2, SB2, ..., Sn, SBn allocated thereto, respectively, are in an enabled state, and may not apply the power supply voltage to the first to $n^{th}$ logic circuits 111, 112, ..., 11n coupled thereto, respectively, when the gating control signals S1, SB1, S2, SB2, ..., Sn, SBn allocated thereto, respectively, are in a disabled state. The first to $n^{th}$ power gating circuits 121, 122, ..., 12n may be zigzag power gating circuits. The coupling relationship of the first to $n^{th}$ logic circuits 111, 112, ..., 11n and the first to $n^{th}$ power gating circuits 121, 122, ..., 12n will be described later.

The power gating control system 130 may generate the plurality of gating control signals S1, SB1, S2, SB2, ..., Sn, SBn. The power gating control system 130 may generate the plurality of gating control signals S1, SB1, S2, SB2, ..., Sn, SBn based on whether the designs of the first to $n^{th}$ power gating circuits 121, 122, ..., 12n coupled with the first to $n^{th}$ logic circuits 111, 112, ..., 11n are appropriately implemented and an operation mode of the semiconductor apparatus 1. Whether the designs of the first to $n^{th}$ power gating circuits 121, 122, ..., 12n are appropriately implemented may be determined based on whether the first to $n^{th}$ logic circuits 111, 112, ..., 11n may generate output signals respectively having the predetermined level when the first to $n^{th}$ power gating circuits 121, 122, ..., 12n are turned off. The power gating control system 130 may generate repair information RI<1:n> by testing whether the output signals of the first to $n^{th}$ logic circuits 111, 112, ..., 11n retain the predetermined logic value when the first to $n^{th}$ power gating circuits 121, 122, ..., 12n are turned off. The power gating control system 130 may generate the plurality of gating control signals S1, SB1, S2, SB2, ..., Sn, SBn based on the repair information RI<1:n> and an operation mode of the semiconductor apparatus 1.

When a logic circuit generates an output signal of the predetermined level or the output signal retains the predetermined logic value as a result of performing a test, the power gating control system 130 may not perform a repair operation, and may selectively enable a gating control signal to be inputted to the logic circuit, depending on an operation mode of the semiconductor apparatus 1. For example, the power gating control system 130 may enable the gating control signal to be inputted to the logic circuit, during the active operation of the semiconductor apparatus 1, and may disable the gating control signal to be inputted to the logic circuit, during the standby operation of the semiconductor apparatus 1. When a logic circuit does not generate an output signal of the predetermined level or the output signal does not retain the predetermined logic value as a result of performing a test, the power gating control system 130 may perform a repair operation, and may enable a gating control signal to be inputted to the logic circuit, regardless of an operation mode of the semiconductor apparatus 1. That is to say, the power gating control system 130 may enable the gating control signal to be inputted to the logic circuit, during not only the active operation of the semiconductor apparatus 1 but also the standby operation of the semiconductor apparatus 1. Therefore, in the case where the design of a power gating circuit coupled with a logic circuit is implemented inappropriately, the power gating control system 130 controls the power gating circuit to always apply the power supply voltage to the logic circuit regardless of an operation mode of the semiconductor apparatus 1, thereby allowing the logic circuit to perform an operation normally. The power gating control system 130 may individually control whether to enable the plurality of gating control signals S1, SB1, S2, SB2, ..., Sn, SBn, by performing a test individually for the first to $n^{th}$ logic circuits 111, 112, ..., 11n and the first to $n^{th}$ power gating circuits 121, 122, ..., 12n.

Referring to FIG. 1, the power gating control system 130 may include a test circuit 131, a repair circuit 132 and a power gating control circuit 133. The test circuit 131 may include a test unit such as automatic test equipment (ATE) or a built-in self test (BIST) circuit. The test circuit 131 may monitor the output signals of the first to $n^{th}$ logic circuits 111, 112, ..., 11n when the first to $n^{th}$ power gating circuits 121, 122, ..., 12n are turned off. In the case where a logic circuit generates an output signal of the predetermined level, it may be determined that the logic circuit operates normally, and it may be determined that a power gating circuit coupled with the logic circuit is designed appropriately. In the case where a logic circuit does not generate an output signal of the predetermined level, it may be determined that the logic circuit does not operate normally, and it may be determined that a power gating circuit coupled with the logic circuit is designed inappropriately. The test circuit 131 may generate the repair information RI<1:n> based on a test result. The repair information RI<1:n> may be a code signal which includes a plurality of bits, and may include an information on the positions of a logic circuit which does not operate normally and a power gating circuit which is coupled with the logic circuit. For example, the test circuit 131 may generate the repair information RI<1:n> of n bits which are related with the first to $n^{th}$ logic circuits 111, 112, ..., 11n and the first to $n^{th}$ power gating circuits 121, 122, ..., 12n, respectively, and may specify a logic circuit which does not operate normally and a power gating circuit which is coupled with the logic circuit, by changing a particular bit among the n bits to a preselected level.

The repair circuit 132 may generate fuse programming signals FR<1:n> based on the repair information RI<1:n>. The repair circuit 132 may include a fuse programming circuit 141. The fuse programming circuit 141 may generate the fuse programming signals FR<1:n> based on the repair information RI<1:n>. The fuse programming signals FR<1:n> may be pulse signals, and may have a voltage level capable of rupturing fuses. For example, the fuse programming signals FR<1:n> may have the level of a boosting voltage or a pumping voltage which has a level higher than the power supply voltage.

The power gating control circuit 133 may generate the gating control signals S1, SB1, S2, SB2, ..., Sn, SBn based on the fuse programming signals FR<1:n> and a power-down signal PD. The power gating control circuit 133 may include a plurality of fuses. The plurality of fuses may be provided by a number corresponding to the number of power gating circuits. For example, the power gating control circuit 133 may include n number of fuses. The n number of fuses may be programmed and/or ruptured based on the fuse programming signals FR<1:n>. The fuses may output fuse signals which have different levels, depending on programmed results or ruptured results. For example, a fuse signal may have a logic low level when a corresponding fuse is ruptured, and a fuse signal may have a logic high level when a corresponding fuse is not ruptured. The power gating control circuit 133 may generate the gating control signals S1, SB1, S2, SB2, ..., Sn, SBn based on the fuse signals and an operation mode of the semiconductor apparatus 1. The power gating control circuit 133 may generate the gating control signals S1, SB1, S2, SB2, ..., Sn, SBn based on the fuse signals and the power-down signal PD. The power-down signal PD as a signal capable of specifying an operation mode of the semiconductor apparatus 1 may be disabled in the active operation of the semiconductor apparatus 1 and be enabled in the standby operation of the semiconductor apparatus 1.

Figure 2:
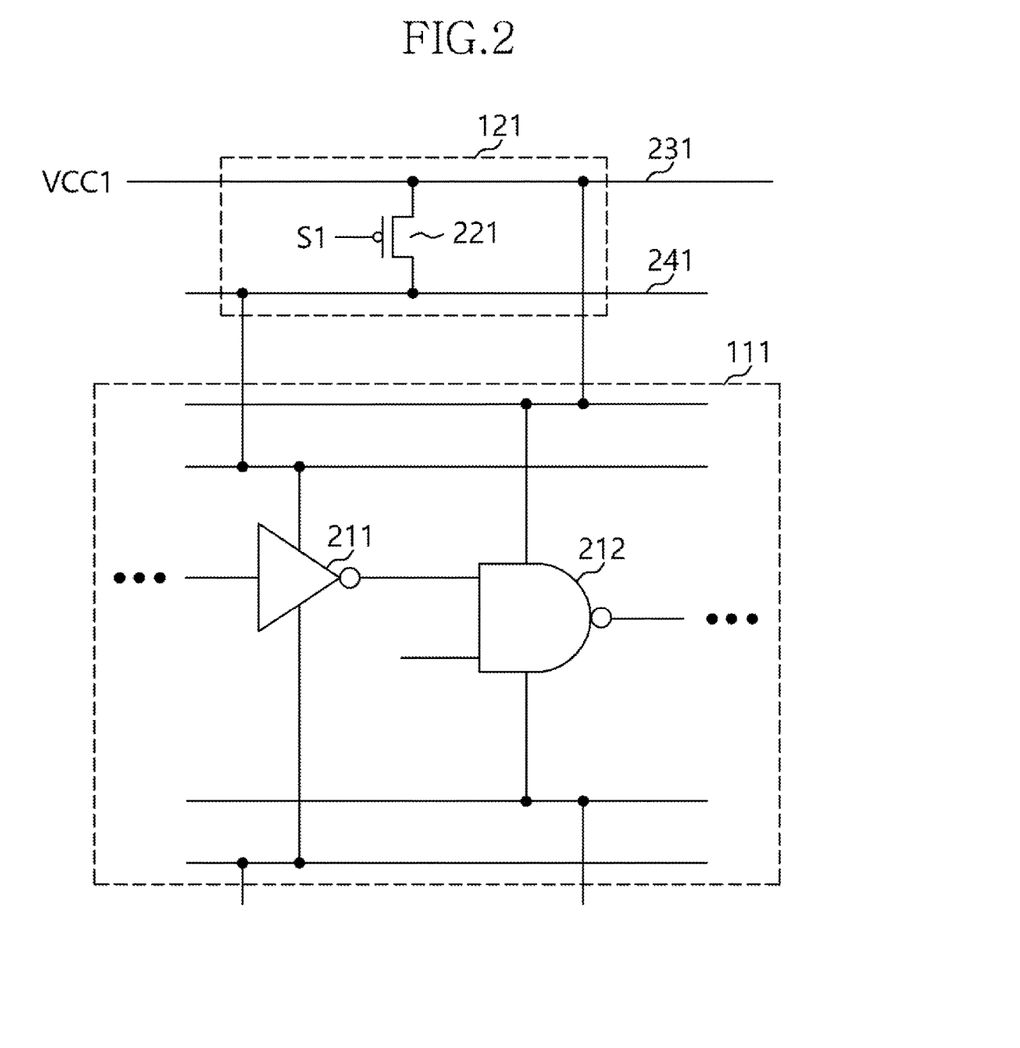
FIG. 2 is a diagram illustrating a representation of an example of a coupling relationship of the first logic circuit and the first power gating circuit illustrated in FIG. 1.

FIG. 2 is a diagram illustrating a representation of an example of a coupling relationship of the first logic circuit 111 and the first power gating circuit 121 illustrated in FIG. 1. Referring to FIG. 2, the first power gating circuit 121 may be a zigzag power gating circuit. The first logic circuit 111 may be coupled with a first power supply voltage line 231 and a first virtual power supply voltage line 241 and receive a first power supply voltage VCC1. The first logic circuit 111 may be coupled with a second power supply voltage line 232 and a second virtual power supply voltage line 242 and receive a second power supply voltage VCC2. The first power supply voltage VCC1 may be supplied to the first power supply voltage line 231. The first power supply voltage VCC1 may be a high voltage, for example, an external voltage applied to the semiconductor apparatus 1 from an exterior. The second power supply voltage VCC2 may be supplied to the second power supply voltage line 232. The second power supply voltage VCC2 may be a low voltage, for example, a ground voltage. The first power gating circuit 121 may include a first gating transistor 221 and a second gating transistor 222. The first gating transistor 221 may couple the first power supply voltage line 231 and the first virtual power supply voltage line 241 based on the gating control signal S1, thereby allowing the first power supply voltage VCC1 to be applied to the first virtual power supply voltage line 241. The second gating transistor 222 may couple the second power supply voltage line 232 and the second virtual power supply voltage line 242 based on the gating control signal SB1, thereby allowing the second power supply voltage VCC2 to be applied to the second virtual power supply voltage line 242.

The first logic circuit 111 may include at least two logic elements. First and second logic elements 211 and 212 may be coupled in series with each other. The first voltage terminal of the first logic element 211 may be coupled with the first virtual power supply voltage line 241, and the second voltage terminal of the first logic element 211 may be coupled with the second power supply voltage line 232. The first voltage terminal of the second logic element 212 may be coupled with the first power supply voltage line 231, and the second voltage terminal of the second logic element 212 may be coupled with the second virtual power supply voltage line 242. When the first power gating circuit 121 is turned off, the first gating transistor 221 may cut off the application of the first power supply voltage VCC1 to the first virtual power supply voltage line 241, and the second gating transistor 222 may cut off the application of the second power supply voltage VCC2 to the second virtual power supply voltage line 242. Accordingly, when the first power gating circuit 121 is turned off, the first logic element 211 may receive only the second power supply voltage VCC2 through the second voltage terminal, and the second logic element 212 may receive only the first power supply voltage VCC1 through the first voltage terminal. Therefore, the output node of the first logic element 211 and the output node of the second logic element 212 may be retained at the predetermined logic value. For example, it is assumed that the first logic element 211 is an inverter and the second logic element 212 is a NAND gate. When the first power gating circuit 121 is turned off, in the case where a signal of a logic high level is applied to the input terminal of the first logic element 211, the output terminal of the first logic element 211 may be a logic low level, and the output terminal of the second logic element 212 may be a logic high level. The logic levels and/or values of the output signals of the first and second logic elements 211 and 212 may be retained.

The first gating transistor 221 may be a header transistor, and may be a P-channel MOS transistor. The first gating transistor 221 may have a gate which receives the gating control signal S1, a source which is coupled with the first power supply voltage line 231 and a drain which is coupled with the first virtual power supply voltage line 241. The second gating transistor 222 may be a footer transistor, and may be an N-channel MOS transistor. The second gating transistor 222 may have a gate which receives the gating control signal SB1, a drain which is coupled with the second virtual power supply voltage line 242 and a source which is coupled with the second power supply voltage line 232. While FIG. 2 illustrates a specific example in which the gating transistors 221 and 222 of the power gating circuit 121 are designed and disposed depending on the first and second logic elements 211 and 212 configuring the first logic circuit 111, it is to be noted that the embodiment is not limited thereto. The design and disposition of the gating transistors of the first power gating circuit 121 may be changed variously depending on the kinds and the coupling sequence of the logic elements of the first logic circuit 111.

Figure 3:
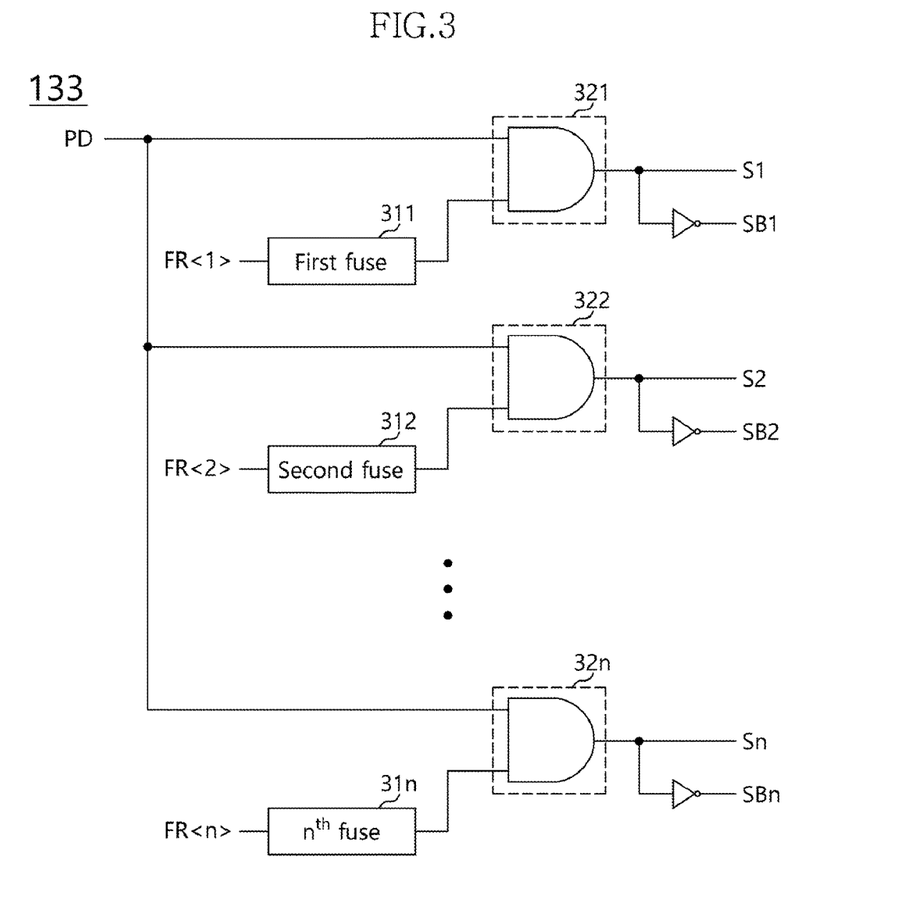
FIG. 3 is a diagram illustrating a representation of an example of the configuration of the power gating control circuit illustrated in FIG. 1.

FIG. 3 is a diagram illustrating a representation of an example of the configuration of the power gating control circuit 133 illustrated in FIG. 1. The power gating control circuit 133 may include one or more fuses and one or more signal combiners. The fuses and the signal combiners may be provided by numbers corresponding to the numbers of power gating circuits and logic circuits. Referring to FIG. 3, the power gating control circuit 133 may include first to $n^{th}$ fuses 311, 312, . . . , 31n and first to $n^{th}$ signal combiners 321, 322, . . . , 32n. The first to $n^{th}$ fuses 311, 312, . . . , 31n may receive the fuse programming signals FR<1:n>, respectively, applied thereto. For example, the first to $n^{th}$ fuses 311, 312, . . . , 31n may be ruptured in the case where the fuse programming signals FR<1:n> applied thereto, respectively, are enabled, and may not be ruptured in the case where the fuse programming signals FR<1:n> applied thereto, respectively, are disabled. The first to $n^{th}$ fuses 311, 312, . . . , 31n may output fuse signals of the logic low level when they are ruptured, and may output fuse signals of the logic high level when they are not ruptured. The first to $n^{th}$ fuses 311, 312, . . . , 31n may not be ruptured when the designs of the first to $n^{th}$ power gating circuits 121, 122, . . . , 12n which are coupled with the first to $n^{th}$ logic circuits 111, 112, . . . , 11n, respectively, are accurately implemented, and may be ruptured for repair when the designs of the first to $n^{th}$ power gating circuits 121, 122, . . . , 12n which are coupled with the first to $n^{th}$ logic circuits 111, 112, . . . , 11n, respectively, are inaccurately implemented.

The first to $n^{th}$ signal combiners 321, 322, . . . , 32n may be coupled with the first to $n^{th}$ fuses 311, 312, . . . , 31n, respectively. The first to $n^{th}$ signal combiners 321, 322, . . . , 32n may generate the gating control signals S1, SB1, S2, SB2, . . . , Sn, SBn based on the fuse signals outputted from the first to $n^{th}$ fuses 311, 312, . . . , 31n coupled thereto, respectively, and the power-down signal PD. The first to $n^{th}$ signal combiners 321, 322, . . . , 32n may enable the gating control signals S1, SB1, S2, SB2, . . . , Sn, SBn based on whether the power-down signal PD is enabled or not, when the first to $n^{th}$ fuses 311, 312, . . . , 31n coupled thereto, respectively, are not ruptured. The first to $n^{th}$ signal combiners 321, 322, . . . , 32n may retain the gating control signals S1, SB1, S2, SB2, . . . , Sn, SBn in an enabled state regardless of whether the power-down signal PD is enabled or not, when the first to $n^{th}$ fuses 311, 312, . . . , 31n coupled thereto, respectively, are ruptured. Each of the first to $n^{th}$ signal combiners 321, 322, . . . , 32n may include an AND gate. The output signals of the first to $n^{th}$ signal combiners 321, 322, . . . , 32n may be provided as the gating control signals S1, S2, . . . , Sn which are inputted to the P-channel MOS transistors of the first to $n^{th}$ power gating circuits 121, 122, . . . , 12n. Moreover, the output signals of the first to $n^{th}$ signal combiners 321, 322, . . . , 32n may be inverted by inverters and be provided as the gating control signals SB1, SB2, . . . , SBn which are inputted to the N-channel MOS transistors of the first to $n^{th}$ power gating circuits 121, 122, . . . , 12n.

Figure 4:
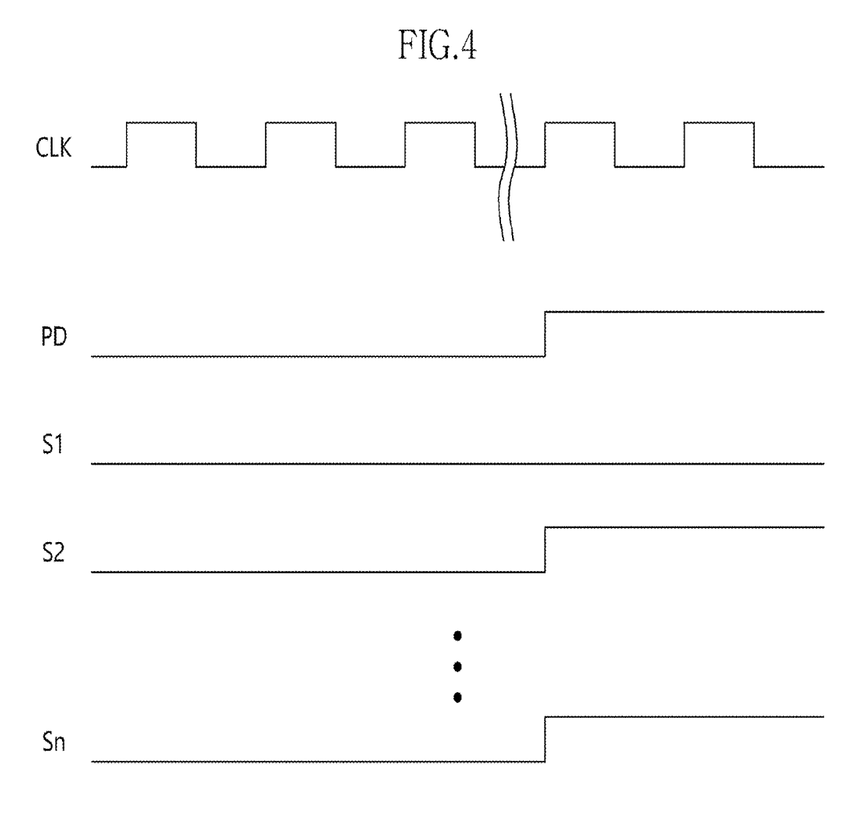
FIG. 4 is a representation of an example of a diagram to assist in the explanation of the operation of the semiconductor apparatus in accordance with the embodiments.

FIG. 4 is a representation of an example of a diagram to assist in the explanation of the operation of the semiconductor apparatus 1 in accordance with an embodiment. The operation of the semiconductor apparatus 1 in accordance with an embodiment will be described below with reference to FIGS. 1 to 4. The test circuit 131 of the power gating control system 130 may perform a test for whether or not the designs of the first to $n^{th}$ power gating circuits 121, 122, . . . , 12n coupled to the first to $n^{th}$ logic circuits 111, 112, . . . , 11n, respectively, are accurately implemented. The test circuit 131 may turn off all the first to $n^{th}$ power gating circuits 121, 122, . . . , 12n and generate a test result based on whether each of the first to $n^{th}$ logic circuits 111, 112, . . . , 11n generates an output signal having the predetermined level. For example, it is assumed that the second to $n^{th}$ logic circuits 112, . . . , 11n retain output signals at the predetermined level but the first logic circuit 111 has not generated an output signal having the predetermined level. The test circuit 131 may determine that the design of the first power gating circuit 121 coupled with the first logic circuit 111 is inappropriately implemented, and may reflect the test result on the repair information RI<1:n>. For example, second to $n^{th}$ bits RI<2:n> of the repair information RI<1:n> may have a logic low level, and a first bit RI<1> of the repair information RI<1:n> may have a logic high level. The repair circuit 132 may perform a repair operation based on the repair information RI<1:n>. The repair circuit 132 may generate the fuse programming signals FR<1:n> based on the repair information RI<1:n>. For example, the repair circuit 132 may enable the fuse programming signal FR<1> and disable the remaining fuse programming signals FR<2:n>. The first fuse 311 may be programmed and/or ruptured based on the fuse programming signal FR<1>, and the ruptured first fuse 311 may output a fuse signal which has the logic low level. The second to $n^{th}$ fuses 312, . . . , 31n may not be ruptured and output fuse signals which have the logic high level.

Thereafter, as the semiconductor apparatus 1 performs a standby operation, the power-down signal PD may be enabled. If the power-down signal PD is enabled, the second to $n^{th}$ signal combiners 322, . . . , 32n may disable the gating control signals S2, SB2, . . . , Sn, SBn to be inputted to the second to the $n^{th}$ power gating circuits 122, . . . , 12n, to a high level, and the second to the $n^{th}$ power gating circuits 122, . . . , 12n may be turned off. The first signal combiner 321 may retain the enabled state of the gating control signals S1 and SB1 to be inputted to the first power gating circuit 121, and the first power gating circuit 121 may retain a turned-on state. When the design of the first power gating circuit 121 is inappropriately implemented and thus the first logic circuit 111 does not retain an output signal at the predetermined level, the repair operation may be performed, and the gating control signals S1 and SB1 to be inputted to the first power gating circuit 121 may always retain the enabled state. Therefore, the first power gating circuit 121 may always apply the first and second power supply voltages VCC1 and VCC2 to the first logic circuit 111 regardless of an operation mode of the semiconductor apparatus 1, and thereby, may prevent the malfunction of the first logic circuit 111.

The semiconductor apparatuses and or methods as discussed above (see FIGS. 1-4) are particular useful in the design of other memory devices, processors, and computer systems. For example, referring to FIG. 5, a block diagram of a system employing a semiconductor apparatus and or method in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 5:
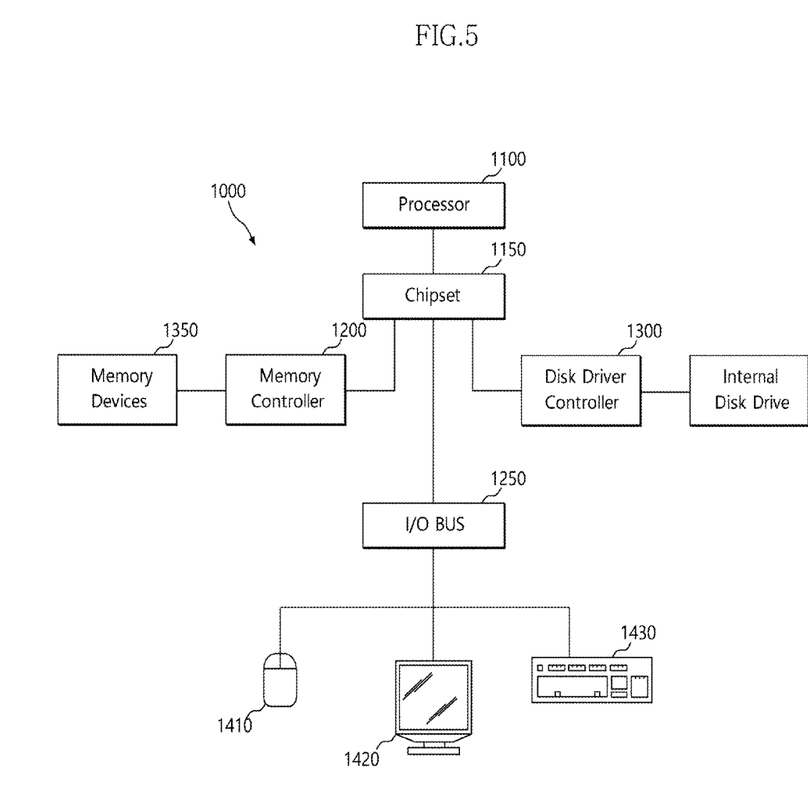
FIG. 5 illustrates a block diagram of an example of a representation of a system employing a semiconductor apparatus and or method of repairing the same with the various embodiments discussed above with relation to FIGS. 1-4.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus and or method as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and or method as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a semiconductor apparatus and or method as discussed above with relation to FIGS. 1-4. In alternate embodiments, such as, for example but not limited to, cellular phones or digital cameras, the components may differ from the embodiments illustrated in FIG. 5.

While various embodiments have been described above, it will be understood to those skilled in the art that the embodiments described are examples only. Accordingly, the semiconductor apparatus including a power gating circuit and the repair method thereof described herein should not be limited based on the described embodiments.

What is claimed is:

1. A semiconductor apparatus comprising:
   a logic circuit configured to operate by receiving a first power supply voltage and a second power supply voltage, and to retain an output signal at a predetermined logic value during a standby operation of the semiconductor apparatus;
   a power gating circuit configured to apply the first power supply voltage and the second power supply voltage to the logic circuit when a gating control signal is in an enabled state; and
   a power gating control system configured to test whether the output signal of the logic circuit retains the predetermined logic value when the power gating circuit is turned off, and to generate the gating control signal based on a test result and an operation mode of the semiconductor apparatus.

2. The semiconductor apparatus according to claim 1, wherein the power gating control system enables the gating control signal during the standby operation of the semiconductor apparatus after determining that the output signal of the logic circuit does not retain the predetermined logic value.

3. The semiconductor apparatus according to claim 1, wherein the power gating control system enables the gating control signal during an active operation of the semiconductor apparatus and disables the gating control signal during the standby operation of the semiconductor apparatus, after determining that the output signal of the logic circuit retains the predetermined logic value.

4. The semiconductor apparatus according to claim 1, wherein the power gating control system comprises:
   a test circuit configured to generate repair information by testing whether the logic circuit retains the output signal at the predetermined logic value;
   a repair circuit configured to generate a fuse programming signal based on the repair information; and
   a power gating control circuit configured to generate the gating control signal based on the fuse programming signal and a power-down signal.

5. The semiconductor apparatus according to claim 4, wherein the power gating control circuit comprises:
   a fuse configured to generate a fuse signal by being programmed based on the fuse programming signal; and
   a signal combiner configured to generate the gating control signal by combining the fuse signal and the power-down signal.

6. The semiconductor apparatus according to claim 5, wherein the power-down signal is disabled in the active operation of the semiconductor apparatus and is enabled in the standby operation of the semiconductor apparatus.

7. The semiconductor apparatus according to claim 1, wherein the power gating circuit comprises:
  a first gating transistor configured to apply the first power supply voltage to a first virtual power supply voltage line based on the gating control signal; and
  a second gating transistor configured to apply the second power supply voltage to a second virtual power supply voltage line based on the gating control signal.

8. The semiconductor apparatus according to claim 7,
  wherein the logic circuit includes at least first and second logic elements,
  wherein a first voltage terminal of the first logic element is coupled with the first virtual power supply voltage line, and a second voltage terminal of the first logic element is coupled with a second power supply voltage line through which the second power supply voltage is supplied, and
  wherein a first voltage terminal of the second logic element is coupled with a first power supply voltage line through which the first power supply voltage is supplied, and a second voltage terminal of the second logic element is coupled with the second virtual power supply voltage line.

9. The semiconductor apparatus according to claim 8,
  wherein the power gating control system enables the gating control signal during the standby operation of the semiconductor apparatus to allow the first power supply voltage and the second power supply voltage to be supplied to the first and second logic elements, respectively, after determining that the output signal of the logic circuit does not retain the predetermined logic value.

10. A repair method of a semiconductor apparatus including a logic circuit and a power gating circuit which applies a first power supply voltage and a second power supply voltage to the logic circuit based on an operation mode of the semiconductor apparatus, the repair method comprising:
  testing whether the logic circuit generates an output signal having a predetermined level when the power gating circuit is turned off; and
  controlling the power gating circuit based on a test result and an operation mode of the semiconductor apparatus.

11. The repair method according to claim 10, wherein, when the logic circuit generates the output signal having the predetermined level, the controlling controls the power gating circuit to apply the first and second power supply voltages to the logic circuit during an active operation of the semiconductor apparatus, and controls the power gating circuit to cut off application of the first and second power supply voltages to the logic circuit during a standby operation of the semiconductor apparatus.

12. The repair method according to claim 10, wherein, when the output signal of the logic circuit does not retain the predetermined level, the controlling controls the power gating circuit to apply the first and second power supply voltages to the logic circuit regardless of an operation mode of the semiconductor apparatus.

13. The repair method according to claim 10, wherein the controlling comprises:
  programming a fuse based on the test result;
  generating a gating control signal based on a fuse signal outputted from the fuse and a power-down signal; and
  controlling the power gating circuit based on the gating control signal.

14. A semiconductor apparatus comprising:
  a first power supply voltage line supplied with a first power supply voltage;
  a first virtual power supply voltage line;
  a second power supply voltage line supplied with a second power supply voltage;
  a second virtual power supply voltage line;
  a power gating circuit configured to apply the first power supply voltage to the first virtual power supply voltage line and to apply the second power supply voltage to the second virtual power supply voltage line, based on a gating control signal;
  a logic circuit coupled with the first power supply voltage line, the first virtual power supply voltage line, the second power supply voltage line, and the second virtual power supply voltage line; and
  a power gating control system configured to generate a repair signal based on whether the logic circuit generates an output signal of a predetermined level when the power gating circuit is turned off, and to generate the gating control signal based on the repair signal and an operation mode of the semiconductor apparatus.

15. The semiconductor apparatus according to claim 14, wherein the power gating circuit comprises:
  a first gating transistor configured to apply the first power supply voltage to the first virtual power supply voltage line based on the gating control signal; and
  a second gating transistor configured to apply the second power supply voltage to the second virtual power supply voltage line based on the gating control signal.

16. The semiconductor apparatus according to claim 15,
  wherein the logic circuit includes at least a first logic element and a second logic element,
  wherein a first voltage terminal of the first logic element is coupled with the first virtual power supply voltage line, and a second voltage terminal of the first logic element is coupled with the second power supply voltage line, and
  wherein a first voltage terminal of the second logic element is coupled with the first power supply voltage line, and a second voltage terminal of the second logic element is coupled with the second virtual power supply voltage line.

17. The semiconductor apparatus according to claim 15,
  wherein the power gating control system enables the gating control signal during the standby operation of the semiconductor apparatus to allow the first power supply voltage and the second power supply voltage to be supplied to the first and second logic elements, respectively, after determining that the output signal of the logic circuit does not retain the predetermined logic value.

18. The semiconductor apparatus according to claim 14, wherein the power gating control system enables the gating control signal during an active operation of the semiconductor apparatus and disables the gating control signal during a standby operation of the semiconductor apparatus, after determining that the output signal of the logic circuit retains a predetermined logic value.

19. The semiconductor apparatus according to claim 14, wherein the power gating control system enables the gating control signal during the standby operation of the semiconductor apparatus after deterring that the output signal of the logic circuit does not retain the predetermined logic value.

20. The semiconductor apparatus according to claim 14, wherein the power gating control system comprises:

a test circuit configured to generate repair information by testing whether the logic circuit generates the output signal of the predetermined level;

a repair circuit configured to generate a fuse programming signal based on the repair information; and a power gating control circuit configured to generate the gating control signal based on the fuse programming signal and a power-down signal.

21. The semiconductor apparatus according to claim 20, wherein the power gating control circuit comprises:

a fuse configured to generate a fuse signal by being programmed based on the fuse programming signal; and a signal combiner configured to generate the gating control signal by combining the fuse signal and the power-down signal.

22. The semiconductor apparatus according to claim 21, wherein the power-down signal is disabled in the active operation of the semiconductor apparatus and is enabled in the standby operation of the semiconductor apparatus.

* * * * *